United States Patent [19]  [11] Patent Number: 4,570,030
Umemoto et al.  [45] Date of Patent: Feb. 11, 1986

[54] SOLAR CELL DEVICE

[75] Inventors: Yoshiyuki Umemoto; Masao Iijima; Masahide Miyagi; Yoshihisa Muramatsu, all of Kanagawa, Japan

[73] Assignee: Fuji Electric Company Ltd., Kanagawa, Japan

[21] Appl. No.: 604,245

[22] Filed: Apr. 26, 1984

[30] Foreign Application Priority Data

Apr. 26, 1983 [JP] Japan ................................ 58-73184

[51] Int. Cl.⁴ .......................................... H01L 31/06
[52] U.S. Cl. ................................................. 136/244
[58] Field of Search ........................ 136/244, 258 AM

[56] References Cited

U.S. PATENT DOCUMENTS 4,281,208 7/1981 Kuwano et al. ............ 136/249 MS

FOREIGN PATENT DOCUMENTS 56-23785 3/1981 Japan ................................ 136/244

Primary Examiner—Aaron Weisstuch
Attorney, Agent, or Firm—Sughrue, Mion, Zinn, Macpeak & Seas

[57] ABSTRACT

A solar cell device in which short-circuiting between a connecting portion of a metal electrode and a transparent electrode of each cell unit is prevented. A plurality of cell units are formed by laminating a transparent electrode, an amorphous silicon layer and a metal electrode disposed on a common transparent substrate, with each two adjacent cell units being connected by an extension of the metal electrode which traverses an edge of the amorphous silicon layer of the cell unit and contacts the exposed extension of the transparent electrode of the adjacent unit. The edge of the amorphous silicon layer traversed by the extension of the metal electrode projects beyond the transparent electrode by a distance significantly greater than the distance between the edges of the amorphous silicon layer and the transparent electrode in the main portion of the cell unit.

3 Claims, 2 Drawing Figures

SOLAR CELL DEVICE

BACKGROUND OF THE INVENTION

The present invention relates to a solar cell device having a plurality of cell units formed by laminating a transparent electrode, an amorphous silicon (a-Si) layer, and a metal electrode disposed on a common transparent substrate, wherein two adjacent cell units are connected by an extension of the metal electrode of one unit which traverses an edge of the a-Si layer so as to contact the exposed extension of the transparent electrode of a unit adjacent to the first unit.

A conventional solar cell device of the type contemplated by the present invention is shown schematically in FIG. 1, wherein a transparent insulating substrate, for instance, a glass sheet 1, is coated with a transparent electrode 2 made of a transparent conducting material of, for example, ITO (tin-doped indium oxide) to form a plurality of isolated regions, Each isolated region is coated with an a-Si layer 3 (shown as a dotted area), which is further coated with a metal electrode 4 (shown as a hatched area). The respective cell units are series-connected by means of an exposed (not covered with the a-Si layer) extension 21 from the transparent electrode 2, which is overlaid with an extension 41 from the metal electrode of an adjacent unit. For connection to an external power supply, an area 22 isolated from the transparent electrode 2 is provided and overlaid with an extension from the rightmost or leftmost cell unit. The area in which the extension 41 crosses an edge of the a-Si layer 3 is indicated at 5 in FIG. 1, and in this area the metal electrode 4 is insulated from the transparent electrode 2 by the a-Si layer whose width (W) is so small that a short-circuit failure can easily occur between the metal electrode and transparent electrode.

An object of the present invention is to provide a solar cell device wherein no short-circuit failure will occur between a metal electrode and a transparent electrode in the region where the metal electrode crosses an a-Si layer.

SUMMARY OF THE INVENTION

This object is achieved by a solar cell device wherein an extension of the metal electrode of one cell unit that is to contact the exposed edge of the transparent electrode of an adjacent unit crosses over an edge of the a-Si layer region that projects from an edge of the transparent electrode of the first unit.

DESCRIPTION OF THE PREFERRED EMBODIMENTS

Figure 1:
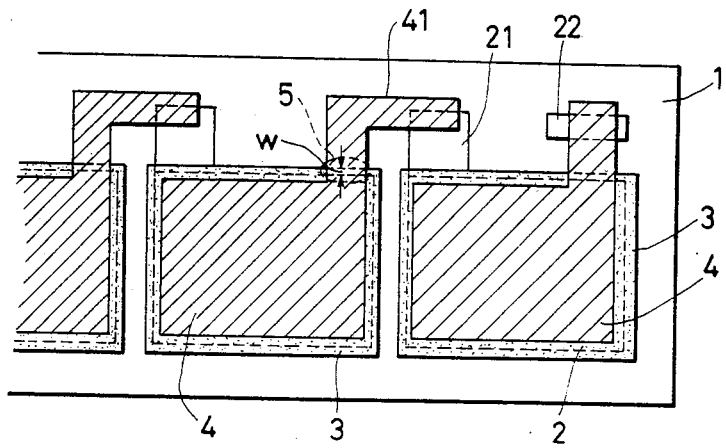
FIG. 1 is a plan view showing a conventional solar cell device.
Figure 2:
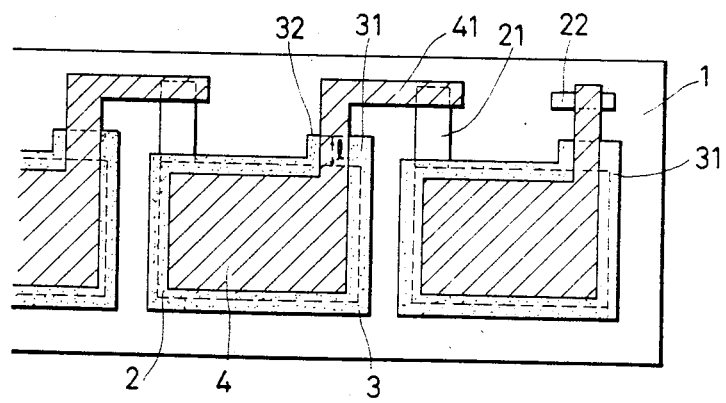
FIG. 2 is a plan view showing a preferred embodiment of a solar cell device of the present invention.

A preferred embodiment of the present invention is shown schematically in FIG. 2, wherein a glass sheet 1 is coated with a transparent electrode 2 which is further coated with an a-Si layer 3 having an extension 31 which reaches beyond an edge of the transparent electrode 2. This a-Si layer may be deposited by decomposition of silane gas through glow discharge. An extension 41 from the metal electrode 4 is routed over the extension 31 and crosses its edge 32 to provide an electrical connection with an extension 21 from the transparent electrode 2 of an adjacent cell unit. The edge 32 is spaced from the periphery of the transparent electrode 2 by a distance l, which is much greater than the width W indicated in FIG. 1 and eliminates the chance of shorting between the metal electrode 4 and transparent electrode 2. A similar design may be employed for providing electrical connection to a terminal transparent electrode region 22.

As described above, in the solar cell device of the present invention, interconnection between two adjacent cell units is provided by a metal electrode that traverses an edge of an a-Si layer in the region that projects from a transparent electrode underneath. This eliminates the chance of a short-circuit failure between the metal electrode and transparent electrode and contributes to the fabrication of a solar cell device having a high reliability.

We claim:

1. In a solar cell device comprising a plurality of cell units formed by laminating a transparent electrode, an amorphous silicon layer and a metal electrode successively on a common transparent substrate, each two adjacent cell units being connected by an extension of the metal electrode of one unit which traverses an edge of the amorphous silicon layer while projecting beyond said amorphous silicon layer in a first direction so as to contact the exposed extension of the transparent electrode of a unit adjacent to said first unit, the improvement wherein said amorphous silicon layer underneath said extension extends beyond an edge of said transparent electrode by an amount greater than the amount that said amorphous silicon layer extends beyond the edge of said transparent electrode in portions not underlying said extension.

2. The solar cell device of claim 1, wherein a length of said edge of said amorphous silicon layer which projects beyond said transparent electrode is substantially greater than the distance between the edge of said amorphous silicon layer and the edge of said transparent electrode in a main portion of each cell unit.

3. The solar cell device of claim 1, wherein the dimension of said amorphous silicon layer in said first direction in the vicinity of said extension is greater than the dimension of said amorphous silicon layer in said first direction in remaining portions of said amorphous silicon layer.

* * * * *